(12) United States Patent
Weyer et al.

(10) Patent No.: US 11,283,437 B2
(45) Date of Patent: Mar. 22, 2022

(54) MEASURING PIN-TO-PIN DELAYS BETWEEN CLOCK ROUTES

(71) Applicant: Skyworks Solutions, Inc., Irvine, CA (US)

(72) Inventors: Daniel Weyer, Austin, TX (US); Raghunandan Kolar Ranganathan, Round Rock, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/717,816

(22) Filed: Dec. 17, 2019

(65) Prior Publication Data

US 2021/0184664 A1    Jun. 17, 2021

(51) Int. Cl.
  *H03K 5/1534* (2006.01)
  *G04F 10/00* (2006.01)
  *H03L 7/08* (2006.01)
  *H03K 5/00* (2006.01)

(52) U.S. Cl.
  CPC ......... *H03K 5/1534* (2013.01); *G04F 10/005* (2013.01); *H03K 2005/00019* (2013.01); *H03L 7/08* (2013.01)

(58) Field of Classification Search
  None
  See application file for complete search history.

(56) References Cited

U.S. PATENT DOCUMENTS

| 6,993,109 B2 * | 1/2006 | Lee ................... H03L 7/0818 375/376 |
| 9,634,861 B2 | 4/2017 | Caffee |
| 9,804,573 B1 | 10/2017 | Drost et al. |
| 10,067,478 B1 | 9/2018 | Ranganathan |
| 2016/0204781 A1 * | 7/2016 | Plusquellic .......... H03K 19/215 326/8 |

OTHER PUBLICATIONS

Ghosh, S., et al., "A Novel Delay Fault Testing Methodology Using Low-Overhead Built-In Delay Sensor," IEEE Transactions on Computer-Aided Design of Integrated Circuits and Systems, vol. 25, No. 12, Dec. 2006, pp. 2934-2943.

(Continued)

*Primary Examiner* — Lincoln D Donovan
*Assistant Examiner* — Khareem E Almo
(74) *Attorney, Agent, or Firm* — Zagorin Cave LLP

(57) ABSTRACT

A method determines a pin-to-pin delay between clock signals having integrally related frequencies. The method includes generating a delay code corresponding to a delay between a first signal edge of a first clock signal received by a first node of an integrated circuit and a second signal edge of a second clock signal received by a second node of the integrated circuit. The delay code is based on a first time code corresponding to the first signal edge, a second time code corresponding to the second signal edge, a first skew code, a second skew code, and a period of the first clock signal or the second clock signal. The first clock signal has a first frequency, the second clock signal has a second frequency, and the second frequency is integrally related to the first frequency.

19 Claims, 7 Drawing Sheets

(56) References Cited

OTHER PUBLICATIONS

Katoh, K., et al., "A Low Area On-Chip Delay Measurement System Using Embedded Delay Measurement Circuit," 2010 19th IEEE Asian Test Symposium, pp. 343-348.
Datta, R., et al., "On-Chip Delay Measurement for Silicon Debug," ACM 2004, pp. 145-148.
Pei, S., et al., "A Low Overhead On-Chip Path Delay Measurement Circuit," 2009 Asian Test Symposium, IEEE Computer Society, pp. 145-150.
Su, C., et al., "All Digital Built-in Delay and Crosstalk Measurement for On-Chip Buses," IEEE Proceedings Design, Automation and Test in Europe Conference and Exhibition, Mar. 27-30, 2000, 5 pages.

\* cited by examiner

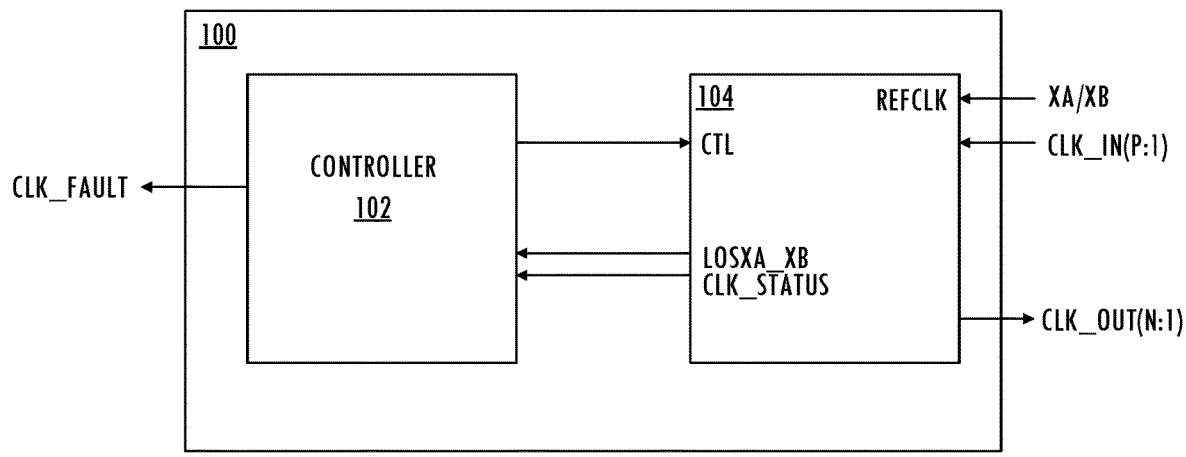
FIG. 1
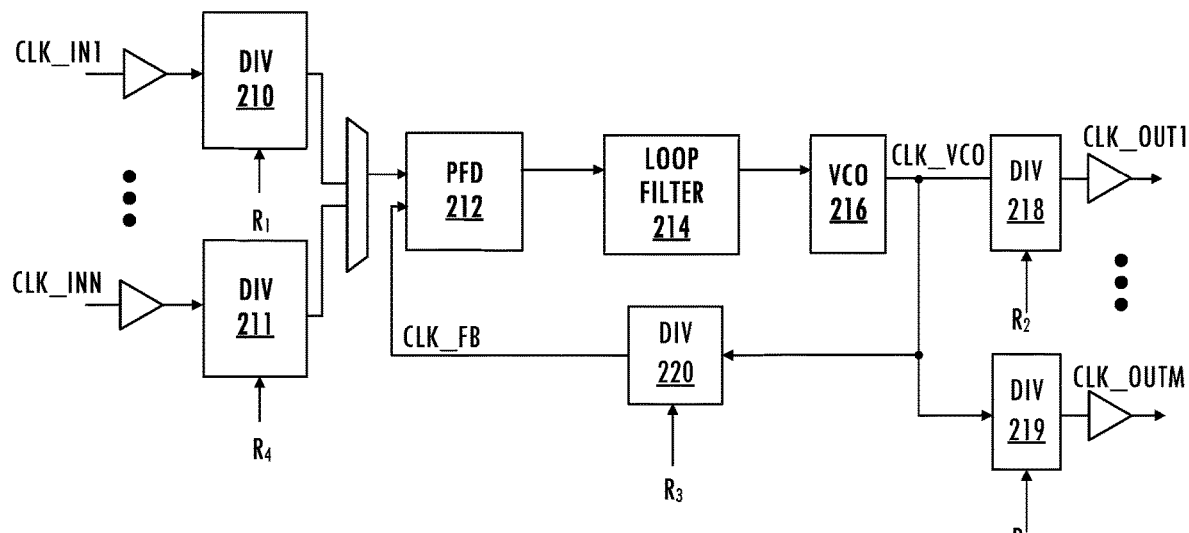
FIG. 2
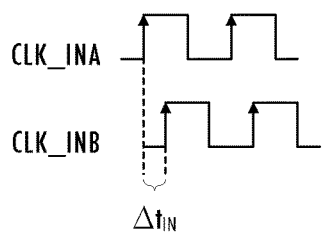
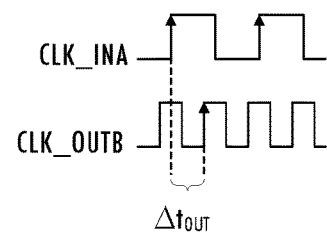
FIG. 3

MEASURING PIN-TO-PIN DELAYS BETWEEN CLOCK ROUTES

BACKGROUND

Field of the Invention

This disclosure is related to integrated circuits and more particularly to clock signals of integrated circuits.

Description of the Related Art

Phase-locked loops are used in network synchronization applications to generate output clock signals that are synchronized to input reference clock signals. A phase-locked loop is a feedback system that aligns signal edges of a reference clock signal and signal edges of a feedback clock signal, synchronizing the frequency and phase of both clock signals. Since the phase of the feedback clock signal tracks the phase of the reference clock signal, the phase of the output clock signal is synchronized to the phase of the reference clock signal. In an exemplary phase-locked loop, the delay of the feedback divider of the phase-locked loop is known. Thus, the time delay between the signal edges of the reference clock signal and the output clock signal is known.

Due to clock redundancy and clock distribution requirements in an exemplary network synchronization application, associated timing products have a substantial number of input clock signals and output clock signals and allow for different clock signal formats. In addition, timing products typically provide flexibility in terms of input clock frequencies and output clock frequencies. To provide these features, peripheral circuits are added at the reference input and at the output of the phase-locked loop (e.g., switches or multiplexers, configurable I/O buffers, and input or output frequency dividers). These additional circuits increase the delay of the corresponding clock paths, thus adding to the known (i.e., deterministic) delay of the phase-locked loop. The input and output clock signals are subject to different route delays on a printed circuit board.

Pin-to-pin delays (e.g., input-to-input (I-I), input-to-output (I-O), or output-to-output (O-O) delays) are critical specifications for synchronization of signals in communications networks. Aggressive delay budgets necessitate system level calibration to compensate for various sources of delay, including delays through printed circuit board traces and buffers. Thus, techniques for measuring and quantifying pin-to-pin delays on printed circuit boards are desired.

SUMMARY OF EMBODIMENTS OF THE INVENTION

In at least one embodiment, a method determines a pin-to-pin delay between clock signals having integrally related frequencies. The method includes generating a delay code corresponding to a delay between a first signal edge of a first clock signal received by a first node of an integrated circuit and a second edge of a second clock signal received by a second node of the integrated circuit. The delay code is generated based on a first time code corresponding to the first signal edge, a second time code corresponding to the second signal edge, a first skew code, a second skew code, and a period of the first clock signal or the second clock signal. The first clock signal has a first frequency, and the second clock signal has a second frequency, and the second frequency is integrally related to the first frequency. The first skew code is indicative of a first delay of a first conductive path coupled between the first node and a time-to-digital converter circuit of the integrated circuit die and the second skew code is indicative of a second delay of a second conductive path coupled between the second node and the time-to-digital converter circuit.

In at least one embodiment, an integrated circuit includes a first node configured to receive a first clock signal having a first frequency. The integrated circuit includes a second node configured to receive a second clock signal having a second frequency. The second frequency is integrally related to the first frequency. The integrated circuit includes a delay measurement circuit comprising a time-to-digital converter circuit. The delay measurement circuit is configured to generate a delay code corresponding to a delay between a first signal edge of the first clock signal received by the first node and a second signal edge of the second clock signal received by the second node. The delay code is generated based on a first time code corresponding to the first signal edge, a second time code corresponding to the second signal edge, a first skew code, a second skew code, and a period of the first clock signal or the second clock signal. The first skew code is indicative of a first delay of a first conductive path coupled between the first node and the time-to-digital converter circuit and the second skew code is indicative of a second delay of a second conductive path coupled between the second node and the time-to-digital converter circuit.

BRIEF DESCRIPTION OF THE DRAWINGS

The present invention may be better understood, and its numerous objects, features, and advantages made apparent to those skilled in the art by referencing the accompanying drawings.

FIG. 1 illustrates a functional block diagram of an exemplary clock product.

FIG. 2 illustrates a functional block diagram of an exemplary clock generator circuit.

FIG. 3 illustrates exemplary waveforms for input-to-input pin delays and input-to-output pin delays.

The use of the same reference symbols in different drawings indicates similar or identical items.

DETAILED DESCRIPTION

Figure 4:
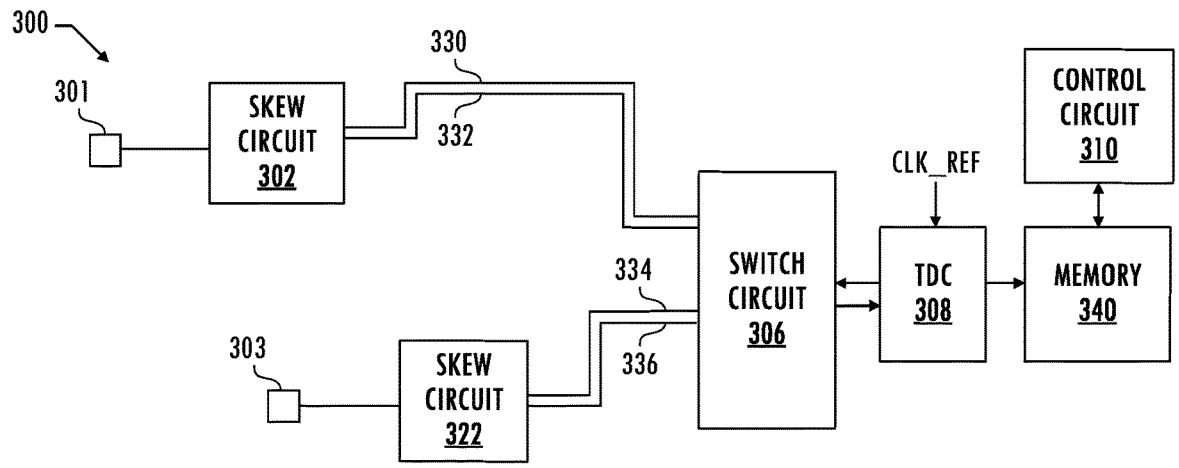
FIG. 4 illustrates a functional block diagram of an exemplary delay measurement circuit consistent with at least one embodiment of the invention.

A technique for estimating route delays on a printed circuit board including an integrated circuit product measures pin-to-pin delays by the integrated circuit product without requiring additional circuitry. The technique accounts for routing mismatches of the integrated circuit product, thereby improving the estimation as compared to other techniques. The delay estimate may be used to adjust clock delays to reduce pin-to-pin delays or other clock latencies. The delay measurement technique is applicable to measuring the delay between input clock signals, output clock signals, input-to-output pairs (e.g., pin-to-pin delay between two input clock signals (input-to-input delay), two output clock signals (output-to-output delay) or an input clock signal and an output clock signal (input-to-output delay)), clock signals of internal nodes of an integrated circuit, or combinations thereof.

Referring to FIG. 1, an embodiment of clock product 100 includes controller 102 and clock generator 104, which monitors at least one received clock signal (e.g., CLK_IN (P:1)) using clock signal REFCLK (e.g., a clock signal generated using a crystal oscillator including an external crystal coupled to XA/XB input terminal) and provides at least one output clock signal CLK_OUT(N:1) and at least one clock quality signal, where P and N are integers greater than zero. Controller 102 provides configuration information to clock generator 104 using interface signals CTL. Clock generator 104 provides clock quality information (e.g., LOSXA_XB or CLK_STATUS) to controller 102, which outputs one or more alarm signals (e.g., CLK_FAULT) based on the clock quality information.

Referring to FIG. 2, an exemplary clock generator includes an analog phase-locked loop and frequency dividers for generating a reference clock signal and a feedback clock signal at target frequencies. The analog phase-locked loop includes phase/frequency detector 212, which receives a reference clock signal selected from outputs of N frequency dividers (e.g., frequency divider 210 or frequency divider 211), loop filter 214, and voltage-controlled oscillator 216. Frequency divider 210 and frequency divider 211 frequency-divide input clock signal CLK_IN1 and CLKINN, respectively. Frequency divider 220, frequency divider 218, and frequency divider 219 divide the frequency of clock signal CLK_VCO to generate feedback clock signal CLK_FB, output clock signal CLK_OUT1, and output clock signal CLK_OUTM, respectively, at target frequencies.

Referring to FIG. 3, an input-to-input pin delay of any two input clock signals of input clock signals CLK_IN(1:N), e.g., clock signal CLK_INA and clock signal CLK_INB, is delay $\Delta t_{IN}$ and the input-to-output pin delay of any input clock signal CLK_IN(1:N) and any output clock signal of output clock signals CLK_OUT(1:M), e.g., clock signal CLK_INA and clock signal CLK_OUTB, is delay $\Delta t_{OUT}$. An exemplary circuit for measuring those delays is illustrated in FIG. 4. In at least one embodiment, delay measurement circuit 300 measures pin-to-pin delays of clock signals communicated by bonding pads that are selectively coupled to time-to-digital converter circuit 308. Bonding pad 301 and bonding pad 303 are exemplary integrated circuit bonding pads. In at least one embodiment, bonding pad 301 and bonding pad 303 each include, or are coupled to, electrostatic discharge circuitry (not shown, e.g., diodes) and a pin or other integrated circuit product terminal. Design of matched routing between multiple bonding pads and a time-to-digital converter on an integrated circuit is challenging for layout design and may not be feasible under some circumstances. Rather than matching the routing for multiple paths to reduce error in delay estimates, the delay measurement technique matches pairs of traces of a conductive path between a bonding pad and switch circuit 306. For example, conductive traces 330 and 332 are matched and are laid out proximate to each other to result in a negligible amount of mismatch. Conductive traces 334 and 336 are matched and are laid out proximate to each other to result in a negligible amount of mismatch. However, conductive traces 330 and 332 are not necessarily matched or laid out proximate to conductive traces 334 and 336.

In at least one embodiment of delay measurement circuit 300, skew circuit 302 and skew circuit 322 are disposed at, or proximate to, bonding pads 301 and 303, respectively, so that any routing between bonding pad 301 or 303 and its corresponding skew circuit is negligible. Switch circuit 306 is configured to enable delay measurements for bonding pads that are associated with different routing paths between the bonding pad and time-to-digital converter circuit 308. Control circuit 310 configures delay measurement circuit 300 to perform delay measurements in two steps to account for on-chip routing mismatch between conductive trace pairs. In at least one embodiment, control circuit 310 includes a microcontroller, microprocessor, or other processing circuit configured to execute instructions stored in memory 340. In at least one embodiment, control circuit 310 is a finite state machine configured to cause delay measurement circuit 300 to perform the delay measurement techniques described herein.

Figure 5:
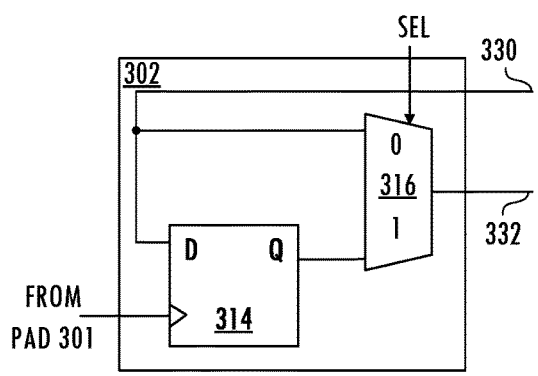
FIG. 5 illustrates a functional block diagram of an exemplary skew circuit consistent with at least one embodiment of the invention.
Figure 6:
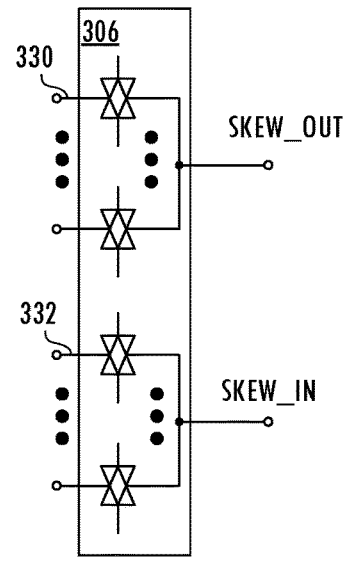
FIG. 6 illustrates a functional block diagram of an exemplary switch circuit consistent with at least one embodiment of the invention.

Referring to FIGS. 4 and 5, in at least one embodiment of delay measurement circuit 300, a skew circuit includes D-flip-flop 314 and 2-to-1 multiplexer circuit 316. In some embodiments, the skew circuit includes additional flip-flops cascaded with D-flip flop 314 to reduce or eliminate metastable events. Each skew circuit is operable in two modes. In a first mode (e.g., control signal SEL has a low signal level), skew circuit 302 is configured as a zero-delay-return path that promptly returns, via conductive trace 332, a signal received from switch circuit 306 via conductive trace 330, and introduces, at most, a negligible delay in skew circuit 302. This mode is used for a time delay (i.e., skew) measurement of the first step. In a second mode (e.g., control signal SEL has a high signal level), skew circuit 302 is configured as a synchronized-pass path that passes a signal edge to switch circuit 306, via conductive trace 332, in response to receiving a signal edge from bonding pad 301. This mode is used for a time measurement of the second step. Referring to FIGS. 4 and 6, in at least one embodiment, switch circuit 306 is implemented as a 2N×2 switch based on transmission gates, where N is the number of bonding pads. Switch circuit 306 couples the SKEW_OUT/SKEW_IN nodes of time-to-digital converter circuit 308 to only one pair of conductive traces of N pairs of conductive traces at a time.

Figure 7:
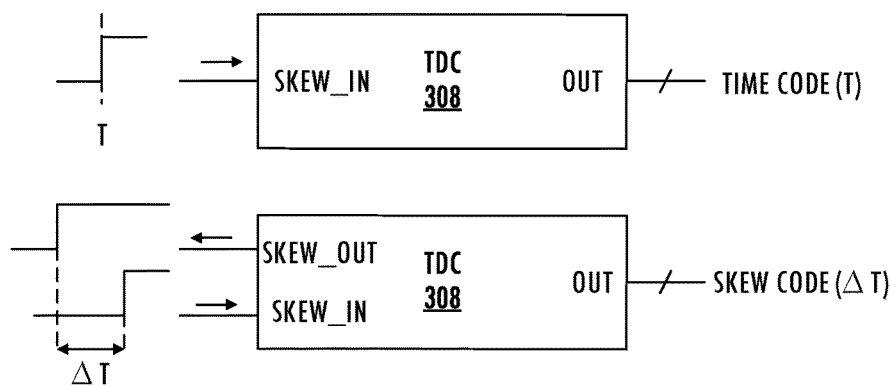
FIG. 7 illustrates functional block diagrams of a first mode and a second mode of an exemplary time-to-digital converter circuit consistent with at least one embodiment of the invention.

Referring to FIGS. 4 and 7, time-to-digital converter circuit 308 has two modes of operation. In a first mode of operation, delay measurement circuit 300 configures time-to-digital converter circuit 308 in a skew mode that is used to estimate a routing mismatch between the two nodes for which a pin-to-pin delay is to be measured. In the skew mode, time-to-digital converter circuit 308 performs a relative time measurement. Time-to-digital converter circuit 308 generates a signal edge (e.g., a rising signal edge) at a dedicated output node (e.g., node SKEW_OUT) that is communicated via a conductive trace of a pair of conductive traces, and receives a returning version of that signal edge via the other conductive trace of the pair of conductive traces at a dedicated input node (e.g., node SKEW_IN). Time-to-digital converter circuit 308 converts the time delay between those events (e.g., the outgoing rising signal edge and the received version of that rising signal edge) into a skew code, i.e., a digital value that represents the time delay between the outgoing signal edge and the returning signal edge. A signal edge provided via node SKEW_OUT arms time-to-digital converter circuit 308 to generate a skew code (ΔT) on the digital code output of time-to-digital converter circuit 308 in response to a next received signal edge on node SKEW_IN. The pairs of conductive traces coupled between the skew circuits and switch circuit 306 include one trace that delivers a signal edge from the time-to-digital converter circuit 308 to the skew circuit and another trace for the signal to return to node SKEW_IN of time-to-digital converter circuit 308. Switch circuit 306 couples node SKEW_OUT of time-to-digital converter circuit 308 to a selected skew circuit and delivers a signal edge generated at node SKEW_OUT to that skew circuit. The skew circuit is configured as a zero-delay-return path that promptly returns the signal edge to switch circuit 306, which delivers the signal edge to node SKEW_IN of time-to-digital converter circuit 308. Time-to-digital converter circuit 308 captures the time delay (i.e., skew) between the signal edges at node SKEW_OUT and node SKEW_IN, thereby generating a digital code indicative of twice the delay of a conductive trace between a skew circuit and time-to-digital converter circuit 308.

In a second mode of operation, delay measurement circuit 300 configures time-to-digital converter circuit 308 in a timestamping mode. In the timestamping mode, time-to-digital converter circuit 308 performs absolute time measurements. For example, time-to-digital converter circuit 308 sends a signal edge from node SKEW_OUT to switch circuit 306. If time-to-digital converter 308 detects a clock edge at its input (e.g., a rising signal edge at node SKEW_IN), time-to-digital converter 308 uses a reference clock signal (e.g., clock signal CLK_REF) to generate time code (T), i.e., a digital value that corresponds to the point in time that the input event occurred. Meanwhile, the skew circuits are configured as synchronized-pass paths, as described above. In this configuration, if a selected skew circuit previously received the signal edge from node SKEW_OUT of time-to-digital converter circuit 308, the selected skew circuit passes a signal edge received at a corresponding bonding pad to the switch circuit 306 via the conductive trace coupled to node SKEW_IN. The digital code output by time-to-digital converter 308 is indicative of the absolute time that a signal edge received on the bonding pad is received at time-to-digital converter 308.

In at least one embodiment, time-to-digital converter circuit 308 includes an $M_1$-bit coarse time-to-digital converter implemented using a ripple counter circuit and an $M_2$-bit fine time-to-digital converter (e.g., a delay-locked loop time-to-digital converter using a flash analog-to-digital converter circuit, a track-and hold circuit followed by a successive approximation register analog-to-digital converter circuit, or combinations thereof), where $M_1$ and $M_2$ are integers greater than zero. In at least one embodiment, time-to-digital converter circuit 308 is implemented using techniques described in U.S. Pat. No. 10,067,478, issued Sep. 4, 2018, entitled "Use of a Recirculating Delay Line with a Time-to-Digital Converter," naming Raghunandan Kolar Ranganathan as inventor, which application is incorporated herein by reference. In at least one embodiment, time-to-digital converter circuit 308 is implemented using techniques described in U.S. Pat. No. 9,804,573, issued Oct. 31, 2017, entitled "Use of Redundancy in Sub-Ranging Time-to-Digital Converters to Eliminate Offset Mismatch Issues," naming Brian G. Drost and Ankur G. Roy as inventors, which application is incorporated herein by reference. However, other time-to-digital converters and techniques for implementing coarse or fine time-to-digital converter circuits may be used.

Figure 8:
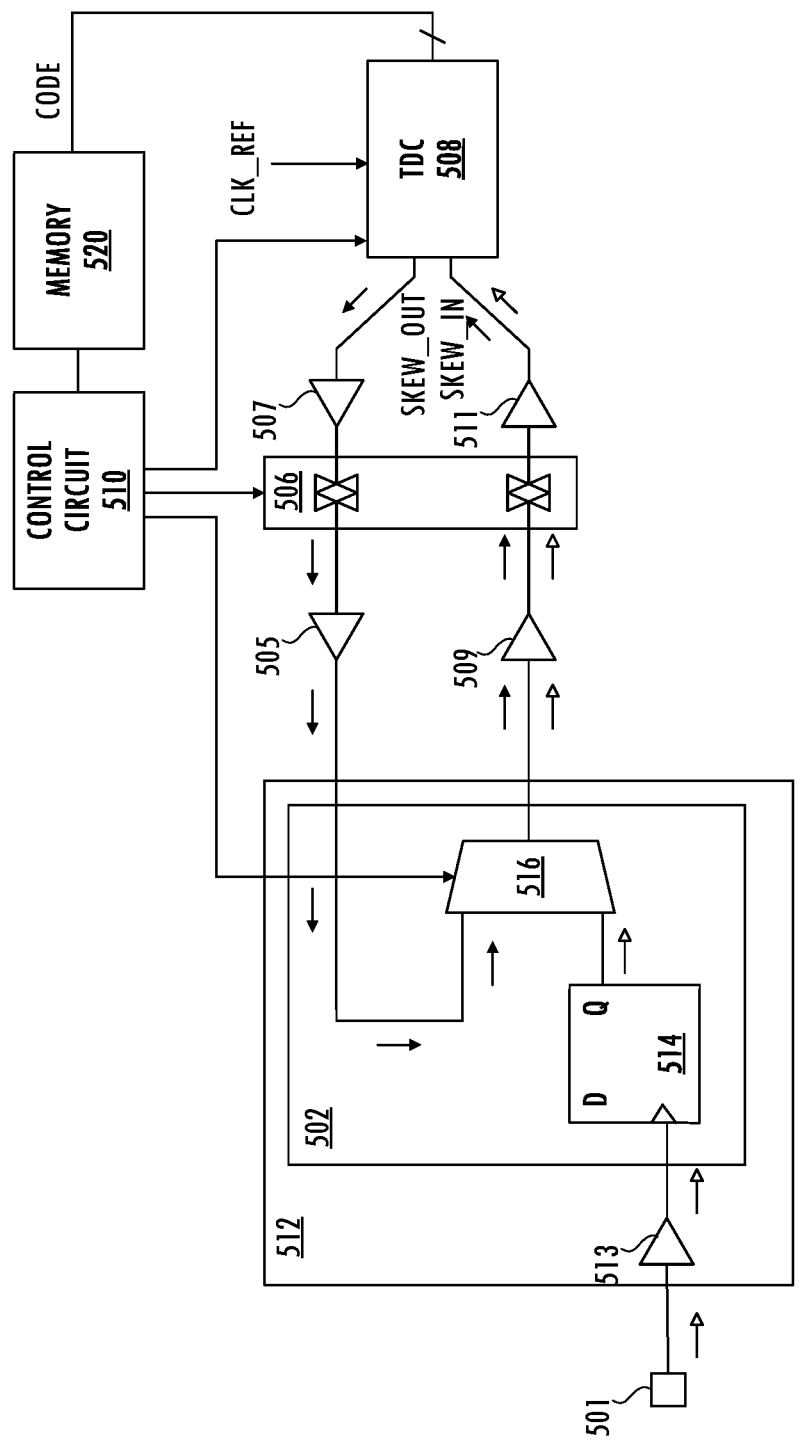
FIG. 8 illustrates a signal flow in a first mode of operation of the delay measurement circuit of FIG. 4 and a signal flow in a second mode of operation of the delay measurement circuit of FIG. 4 consistent with at least one embodiment of the invention.

FIG. 8 illustrates exemplary signal paths for the first mode of operating a delay measurement circuit consistent with the disclosure herein that generates skew codes and the signal paths for the second mode of operating the delay measurement circuit that generates time codes. The first mode that generates skew codes is indicated by filled arrowheads and the second mode that generates time codes is indicated by open arrowheads. Bonding pad 501 may be an input bonding pad or an output bonding pad coupled to skew circuit 502. In at least one embodiment, skew circuit 512 includes input buffer 513. The skew code of bonding pad 501 accounts for the delay of a signal starting at node SKEW_OUT of time-to-digital converter circuit 508, through refresh buffer 507, refresh buffer 505, refresh buffer 509, refresh buffer 511, twice the delay of select circuit 506, and any routing delay of conductive traces therebetween. In this configuration, any delay through multiplexer circuit 516 is negligible. The time code for bonding pad 501 accounts for the delay of input buffer 513, state element 514, refresh buffer 509, select circuit 506, refresh buffer 511, and conductive traces therebetween. In this configuration, any delay through multiplexer circuit 516 is negligible. The path between bonding pad 501 and time-to-digital converter circuit 508 includes delays that are common mode with respect to another path between another bonding pad and time-to-digital converter circuit 508. For example, the delay of input buffer 513, state element 514, multiplexer circuit 516, and select circuit 506 are common mode delays in some embodiments. In addition, any delay between select circuit 506 and time-to-digital converter 508 (e.g., refresh buffer 507 and refresh buffer 511) is a common mode delay. When subtracting skew codes associated with bonding pad 501 from the skew code associated with another bonding pad, common mode delays associated with those bonding pads cancel each other, leaving only the difference in delays between those paths between distinct bonding pads and time-to-digital converter circuit 508. Controller 510 generates control signals for the first mode or the second mode and stores digital code outputs from time-to-digital converter 508 in memory 520.

Figure 9:
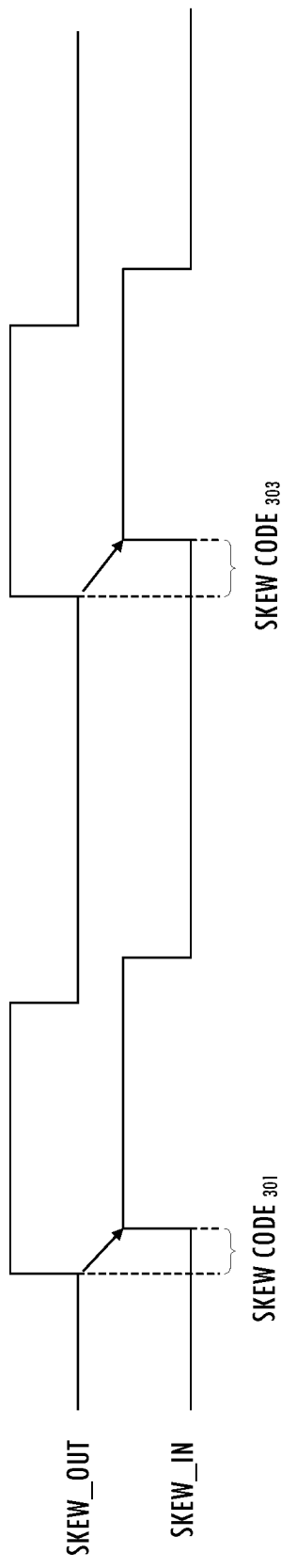
FIG. 9 illustrates exemplary waveforms for the delay measurement circuit of FIG. 4 configured in a first mode consistent with at least one embodiment of the invention.

Referring to FIGS. 4 and 9, in at least one embodiment of delay measurement circuit 300, in the first mode of operation, control circuit 310 configures each skew circuit to provide a zero-delay-return path, as described above, timeto-digital converter circuit 308 in the skew mode, as described above, and time-to-digital converter circuit 308 to generate skew codes for consecutively selected bonding pads (e.g., bonding pad 301 and bonding pad 303). Control circuit 310 causes switch circuit 306 to sequentially couple each bonding pad to time-to-digital converter circuit 308 for a skew measurement. The trace delay difference between conductive paths associated with bonding pad 301 and bonding pad 303 is (skew $code_{301}$−skew $code_{303}$)/2, where skew $code_{303}$=2×trace delay associated with bonding pad 303 and skew $code_{301}$=2×trace delay associated with bonding pad 301.

In at least one embodiment, time-to-digital converter circuit 308 has a predetermined operating range that detects delays between a minimum delay value and a maximum delay value. However, the delay between the signal edge at node SKEW_OUT and the signal edge at node SKEW_IN can be outside the predetermined operating range of time-to-digital converter circuit 308 since the traces have arbitrary lengths. In at least one embodiment, time-to-digital converter circuit 308 is configurable to handle arbitrary trace delays that are outside of a predetermined operating range of time-to-digital converter circuit 308. Rather than generating a single signal edge at node SKEW_OUT, time-to-digital converter circuit 308 uses a finite-state machine to generate multiple pulses separated by period $T_{PER}$ at node SKEW_OUT and to select an index of the pulse at node SKEW_IN. This technique adjusts the effective pulse width to be within the range of time-to-digital converter circuit 308. Control circuit 310 removes the corresponding adjustment values when computing the trace delay.

Figure 10:
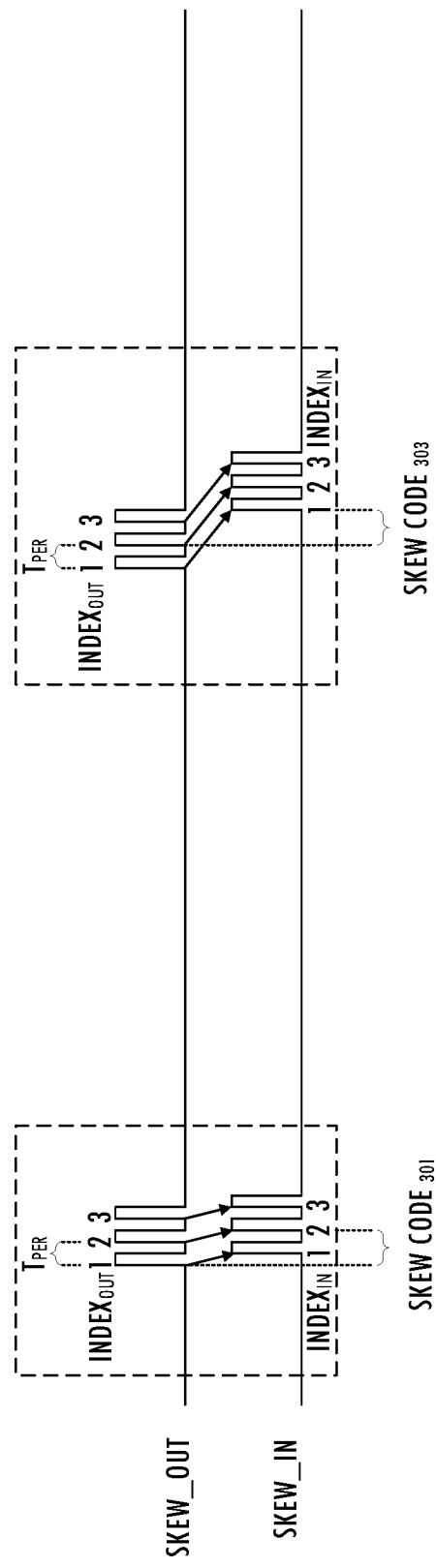
FIG. 10 illustrates exemplary waveforms for the delay measurement circuit of FIG. 4 with an adjustable pulse width to fit within the range of the time-to-digital converter circuit consistent with at least one embodiment of the invention.

For example, referring to FIGS. 4 and 10, time-to-digital converter circuit 308 generates three pulses at node SKEW_OUT and selects indices of the output signal edge at node SKEW_OUT and the return signal edge at node SKEW_IN (e.g., $INDEX_{OUT}$=1 and $INDEX_{IN}$=2) for use in generating corresponding skew signals. If time-to-digital converter circuit 308 is coupled to trace 330 and trace 332 having a delay that is much less than the range of time-to-digital converter circuit 308 (i.e., the delay is relatively small), then time-to-digital converter circuit 308 selects indices that effectively add period $T_{PER}$ to the signal edge at node SKEW_IN, e.g., $INDEX_{OUT}$=1 and $INDEX_{IN}$=2:

$$skew\ code_{301} = 2 \times trace\ delay_{301}$$
$$+ (INDEX_{IN} - INDEX_{OUT}) \times T_{PER}$$
$$= 2 \times trace\ delay_{301} + T_{PER}.$$

If time-to-digital converter circuit 308 is coupled to trace 334 and trace 336 having a delay that is much greater than the range of time-to-digital converter circuit 308 (i.e., the delay is relatively large), then time-to-digital converter circuit 308 selects indices that effectively subtract period $T_{PER}$ from the signal edge at node SKEW_IN, e.g., and $INDEX_{OUT}$=2 and $INDEX_{IN}$=1:

$$skew\ code_{303} = 2 \times trace\ delay_{303} +$$
$$(INDEX_{IN} - INDEX_{OUT}) \times T_{PER}$$
$$= 2 \times trace\ delay_{303} + T_{PER}.$$

When computing the trace delay difference between conductive paths associated with bonding pad 301 and bonding pad 303, delay measurement circuit 300 adjusts skew $code_{301}$ by subtracting $T_{PER}$ and adjusts skew $code_{303}$ by adding $T_{PER}$. The resulting difference divided by two is the delay between conductive paths associated with bonding pad 301 and bonding pad 303:

$$((skew\ code_{301} - T_{PER}) - (skew\ code_{303} + T_{PER}))/2.$$

Note that other numbers of pulses may be used.

Figure 11:
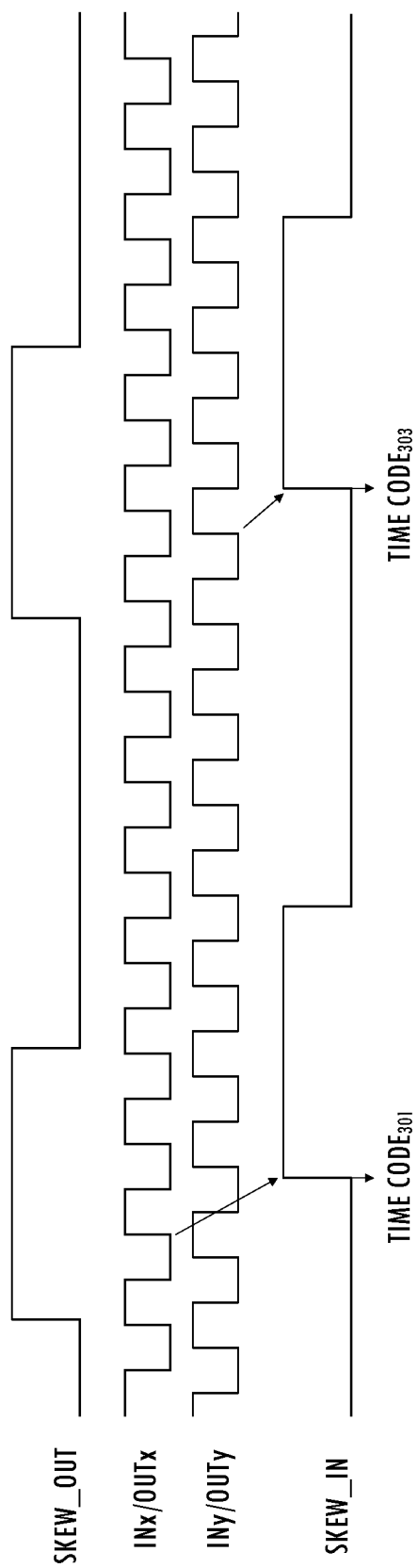
FIG. 11 illustrates exemplary waveforms for the delay measurement circuit of FIG. 4 configured in a second mode consistent with at least one embodiment of the invention.

Referring to FIGS. 4 and 11, in at least one embodiment, in the second mode of operation, delay measurement circuit 300 uses signals received on each bonding pad that are the same frequency or integrally related in frequency. Control circuit 310 configures the skew circuits to provide synchronized-pass paths. Control circuit 310 causes switch circuit 306 to sequentially couple corresponding skew circuits to time-to-digital converter circuit 308 for two consecutive time measurements. Control circuit 310 configures time-to-digital converter circuit 308 in the timestamping mode and to perform two consecutive absolute time measurements: one absolute time measurement for an event at each bonding pad (e.g., a rising signal edge at the bonding pad that is captured by time-to-digital converter circuit 308). Each digital time measurement value (e.g., time code 301 and time code 303) includes the trace delays between the respective skew circuit and switch circuit 306. Control circuit 310 processes the two digital time codes (e.g., time code 301 and time code 303) to quantify the input-to-input, input-to-output, or output-to-output delay.

Control circuit 310 generates the input-to-input, input-to-output, or output-to-output delay using the skew codes, time codes, and the signal period information as follows:

$$(time\ code_{303} - time\ code_{301}) mod(min(period_{301}, period_{303})) - trace\ delay\ difference,$$

where the trace delay difference is (skew $code_{303}$−skew $code_{301}$)/2, $period_{301}$ is the period of the clock signal received by bonding pad 301 in the second mode, and $period_{303}$ is the period of the clock signal received by bonding pad 301 in the second mode.

Figure 12:
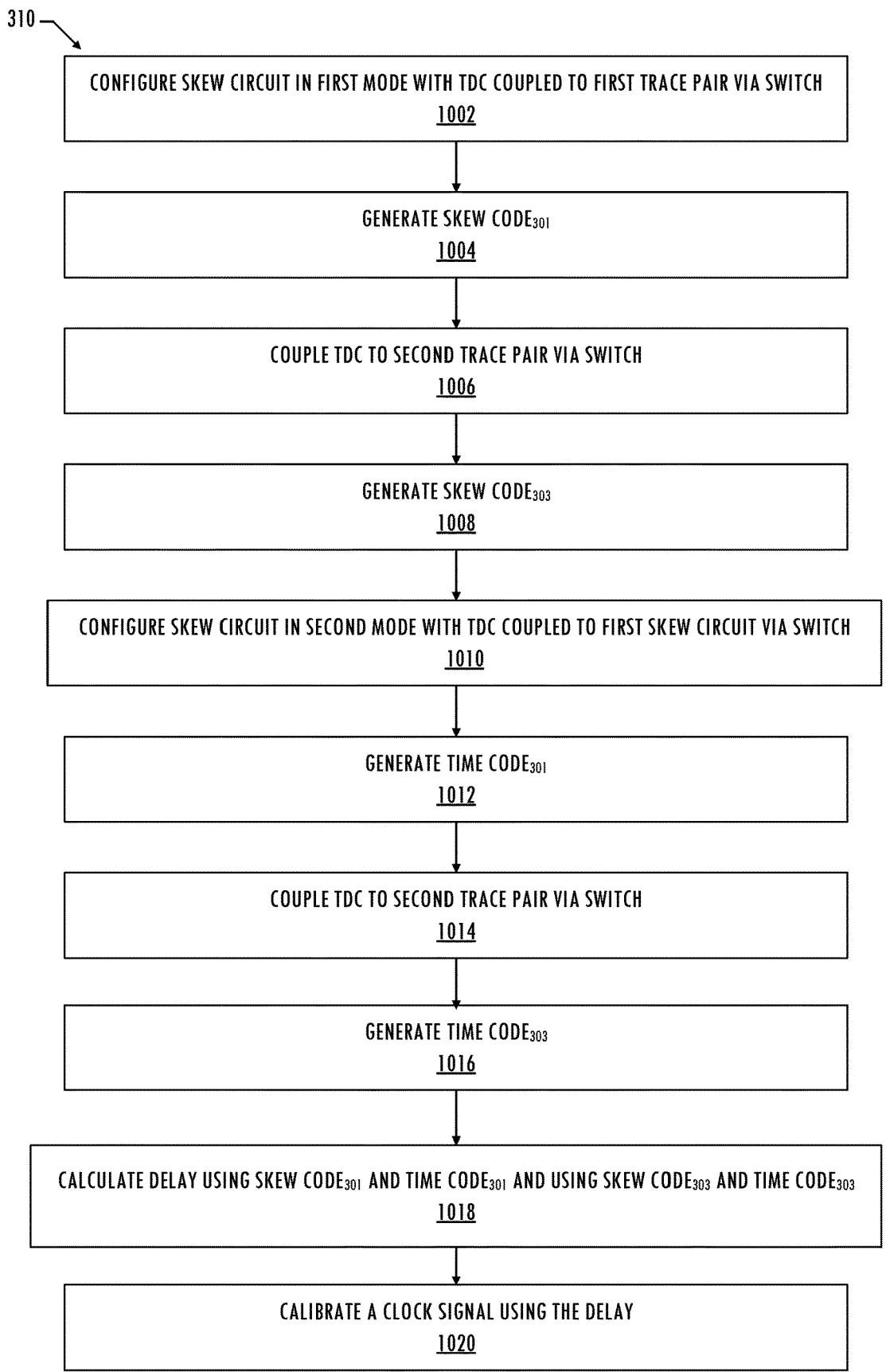
FIG. 12 illustrates an exemplary information and control flow of the delay measurement circuit of FIG. 4 consistent with at least one embodiment of the invention.

Referring to FIGS. 4 and 12, in at least one embodiment of delay measurement circuit 300, control circuit 310 configures paths associated with bonding pad 301 and bonding pad 303 to estimate a pin-to-pin delay between bonding pad 301 and bonding pad 303. Control circuit 310 configures delay measurement circuit 300 in the first mode, which includes configuring skew circuits 302 and 322 for zero-delay return paths and coupling time-to-digital converter circuit 308 to trace 330 and trace 332 via switch circuit 306 (1002). Control circuit 310 configures time-to-digital converter circuit 308 to generate a signal edge on node SKEW_OUT and to generate skew $code_{301}$ in response to receiving that signal edge by time-to-digital converter circuit 308 on node SKEW_IN (1004). Next, control circuit 310 couples time-to-digital converter circuit 308 to trace 334 and trace 336 via switch circuit 306 (1006). Then, control circuit 310 configures time-to-digital converter circuit 308 to generate a signal edge on node SKEW_OUT and to generate skew $code_{303}$ in response to receiving that signal edge by time-to-digital converter circuit 308 on node SKEW_IN (1008).

Next, control circuit 310 configures delay measurement circuit 300 in the second mode, which includes configuring skew circuits 302 and 304 as synchronized pass paths responsive to a signal on node SKEW OUT and some embodiments include coupling time-to-digital converter circuit 308 to trace 330 and trace 332 via switch circuit 306

(1010). Control circuit 310 configures time-to-digital converter circuit 308 to generate a signal edge on node SKEW OUT and time code$_{301}$ in response to receiving a signal edge from bonding pad 301 on node SKEW_IN (1012). Then, control circuit 310 couples time-to-digital converter circuit 308 to trace 334 and trace 336 via switch circuit 306 (1014). Control circuit 310 configures time-to-digital converter circuit 308 to generate a signal edge on node SKEW_OUT and time code$_{303}$ receiving a signal edge from bonding pad 303 on node SKEW_IN (1016). Next, control circuit 310 calculates a delay between bonding pad 301 and bonding pad 303 using skew code$_{301}$, time code$_{301}$, skew code$_{303}$, and time code$_{303}$, and the minimum of the period of the clock signal on bonding pad 301 and the period of the clock signal on bonding pad 303 (1018). Note that in other embodiments, steps 1010-1016 are performed before steps 1002-1008. Other embodiments may use a different order that does not affect data dependencies to perform the steps illustrated in FIG. 12.

Figure 13:
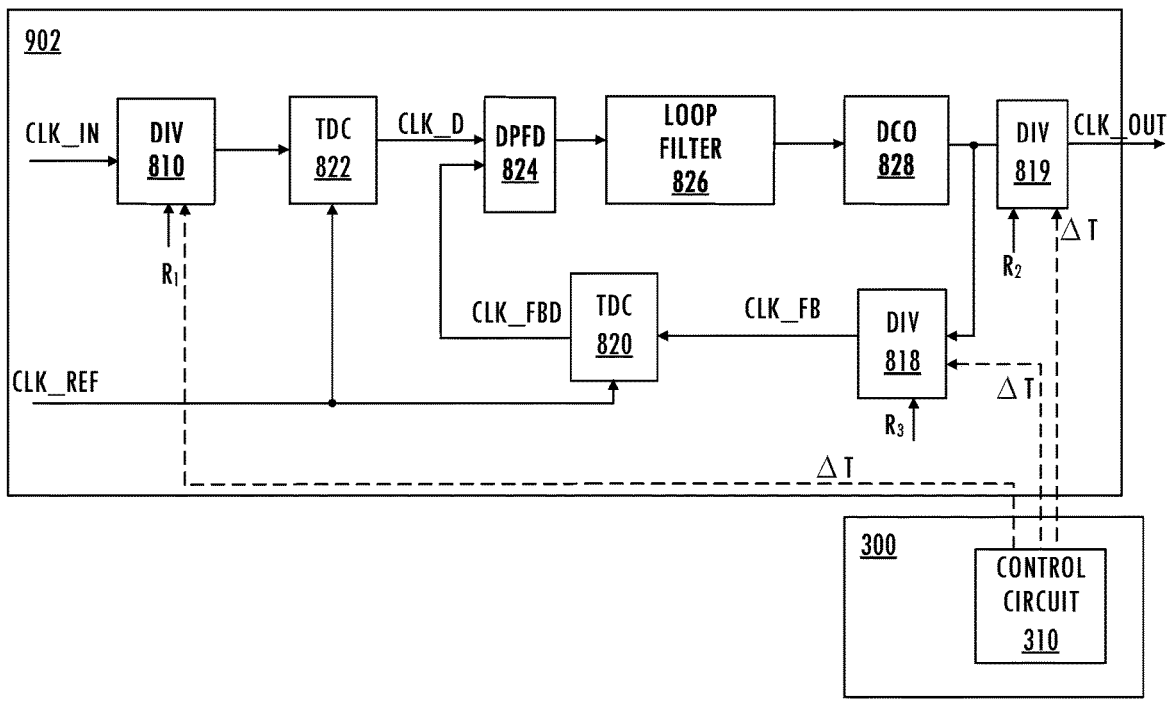
FIG. 13 illustrates a functional block diagram of an exemplary clock generator circuit configured to adjust the delay between an input clock signal and an output clock signal based on a delay measurement consistent with at least one embodiment of the invention.

In at least one embodiment of an integrated circuit product, control circuit 310 uses the delay to calibrate a clock signal derived from a clock signal received by bonding pad 301 or a clock signal received by bonding pad 303 (1020). For example, referring to FIG. 13, control circuit 310 uses the measured delay to provide phase adjustment ΔT to input frequency divider 810, feedback frequency divider 818, or output frequency divider 819 of clock generator 902, which receives clock signal CLK_IN that is derived from a clock signal received on bonding pad 301 and provides a clock signal derived from clock signal CLK_OUT to bonding pad 303. In other embodiments, phase adjustment ΔT is introduced at digital phase/frequency detector 824, loop filter 826, or digitally controlled oscillator 828.

Figure 14:
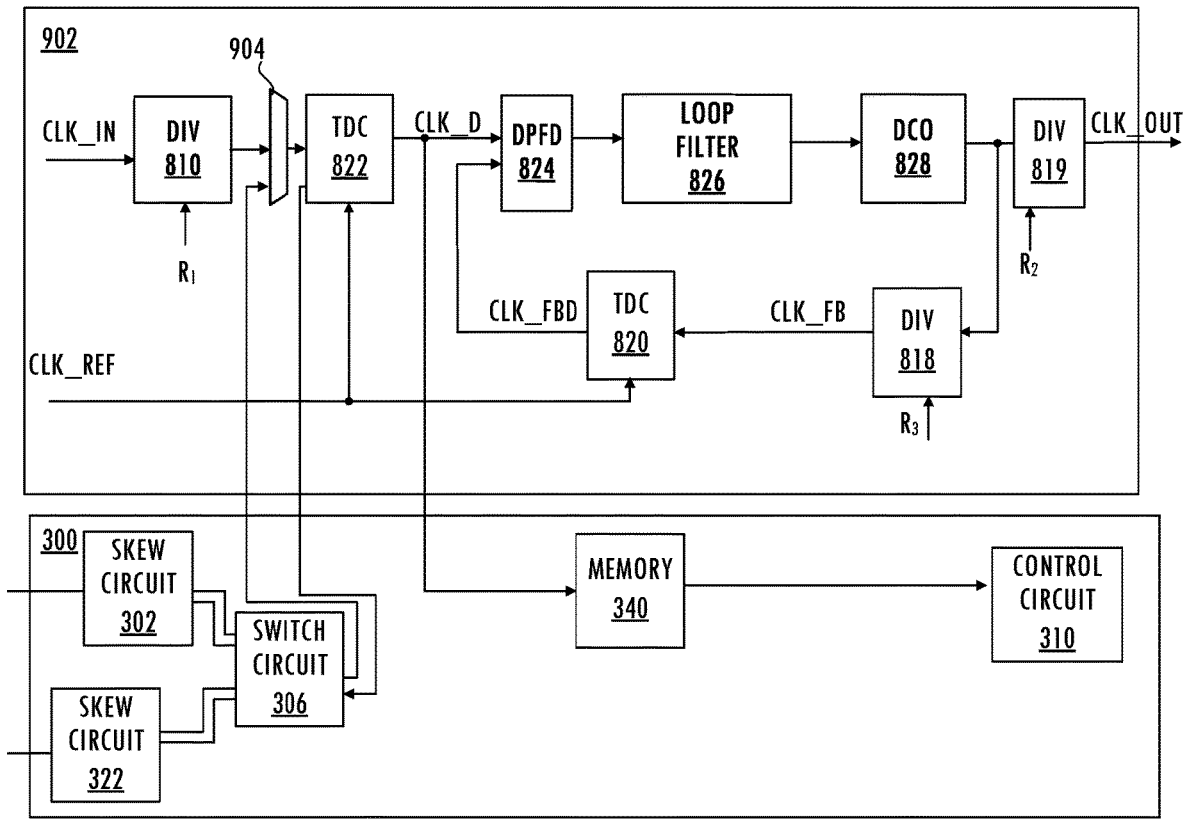
FIG. 14 illustrates a functional block diagram of an exemplary delay measurement circuit using a time-to-digital converter of a clock generator circuit consistent with at least one embodiment of the invention.

In at least one embodiment of an integrated circuit product, the delay measurement technique shares hardware of a clock product with another function of the clock product. Referring to FIG. 14, in some embodiments, time-to-digital converter circuit 822 is shared between delay measurement circuit 300 and clock generator 902, which operates during a target application separately from a mode of operation for estimating the delay between pins of the integrated circuit product. For example, time-to-digital converter circuit 822 of clock generator 902 is used in delay measurement circuit 300 in a delay estimation mode of the integrated circuit product and also used by a phase-locked loop of clock generator 902 during a clock generation mode of operation of the integrated circuit product. The delay measurement may be repeated periodically to capture delay variations due to aging or temperature variations. In other embodiments, select circuit 904 is located at the input of time-to-digital converter circuit 820 and time-to-digital converter circuit 820 is shared between delay measurement circuit 300 and clock generator 902.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium. The tangible computer-readable media may store instructions as well as data that can be used to implement the invention. The instructions/data may be related to hardware, software, firmware or combinations thereof.

Thus, techniques for estimating pin-to-pin delays are disclosed. The description of the invention set forth herein is illustrative and is not intended to limit the scope of the invention as set forth in the following claims. For example, while the invention has been described in an embodiment in which pin-to-pin delays are measured, one of skill in the art will appreciate that the teachings herein can be utilized with measurements of delays between nodes internal to an integrated circuit product. Variations and modifications of the embodiments disclosed herein may be made based on the description set forth herein, without departing from the scope of the invention as set forth in the following claims.

What is claimed is:

1. A method for determining a pin-to-pin delay between clock signals having integrally related frequencies, the method comprising:
    generating a delay code corresponding to a delay between a first signal edge of a first clock signal received by a first bonding pad of an integrated circuit and a second signal edge of a second clock signal received by a second bonding pad of the integrated circuit, the delay code being generated based on a first time code corresponding to the first signal edge, a second time code corresponding to the second signal edge, a first skew code, a second skew code, and a period of the first clock signal or the second clock signal, the first clock signal having a first frequency, the second clock signal having a second frequency, the second frequency being integrally related to the first frequency, the first skew code being indicative of a first delay of a first conductive path coupled between the first bonding pad and a time-to-digital converter circuit of the integrated circuit die, and the second skew code being indicative of a second delay of a second conductive path coupled between the second bonding pad and the time-to-digital converter circuit.

2. The method as recited in claim 1 further comprising using the time-to-digital converter circuit to generate the first skew code, the second skew code, the first time code, and the second time code based on a reference clock signal.

3. The method as recited in claim 1 further comprising:
    configuring the time-to-digital converter circuit, a first skew circuit, and a second skew circuit to operate in a first mode, the first skew code and the second skew code being generated while the time-to-digital converter circuit, the first skew circuit, and the second skew circuit are configured to operate in the first mode, the first skew circuit being disposed proximate to the first bonding pad, and the second skew circuit being disposed proximate to the second bonding pad; and
    configuring the time-to-digital converter circuit, the first skew circuit, and the second skew circuit to operate in a second mode, the first time code and the second time code being generated while the time-to-digital converter circuit, the first skew circuit, and the second skew circuit are configured to operate in the second mode.

4. The method as recited in claim 1 further comprising:
    coupling the time-to-digital converter circuit to a first skew circuit, the first skew circuit being disposed proximate to the first bonding pad;
    generating a transition of a skew output signal on a first conductor by the time-to-digital converter circuit;
    receiving the transition by the first skew circuit and resending the transition with negligible delay by the first skew circuit;
    receiving the transition from the first skew circuit as a skew input signal on a second conductor by the time-to-digital converter circuit; and generating the first skew code based on the transition on the first conductor, the transition on the second conductor, and a reference clock signal by the time-to-digital converter circuit.

5. The method as recited in claim 4 further comprising:
coupling the time-to-digital converter circuit to a second skew circuit, the second skew circuit being disposed proximate to the second bonding pad;
generating a second transition of a second skew output signal on the first conductor by the time-to-digital converter circuit;
receiving the second transition by the second skew circuit and resending the transition with negligible delay by the second skew circuit;
receiving the transition from the second skew circuit as the skew input signal on the second conductor by the time-to-digital converter circuit; and
generating the second skew code based on the transition on the first conductor, the transition on the second conductor, and the reference clock signal by the time-to-digital converter circuit.

6. The method as recited in claim 1 further comprising:
coupling the time-to-digital converter circuit to a first skew circuit, the first skew circuit being disposed proximate to the first bonding pad;
generating a plurality of pulses each having a first period on a first conductor by the time-to-digital converter circuit;
receiving the plurality of pulses by the first skew circuit and resending the plurality of pulses with negligible delay by the first skew circuit;
receiving the plurality of pulses from the first skew circuit as a skew input signal on a second conductor by the time-to-digital converter circuit; and
generating the first skew code based on a first index to a first transition of the plurality of pulses on the first conductor, a second index to a second transition of the plurality of pulses on the second conductor, the first period, and a reference clock signal by the time-to-digital converter circuit.

7. The method as recited in claim 1 further comprising:
coupling the time-to-digital converter circuit to a first skew circuit, the first skew circuit being disposed proximate to the first bonding pad;
passing a signal edge received from the first bonding pad by the first skew circuit via a conductor to the time-to-digital converter circuit; and
generating the first time code by the time-to-digital converter circuit based on the signal edge and a reference clock signal.

8. The method as recited in claim 7 further comprising:
coupling the time-to-digital converter circuit to a second skew circuit, the second skew circuit being disposed proximate to the second bonding pad;
passing a second signal edge received from the second bonding pad by the second skew circuit via the conductor to the time-to-digital converter circuit; and
generating the second time code by the time-to-digital converter circuit based on the second signal edge and the reference clock signal.

9. The method as recited in claim 1 further comprising calibrating a third clock signal derived from the first clock signal or the second clock signal using the delay code.

10. The method as recited in claim 1 wherein generating the delay code comprises:
determining a modulus of a difference between the first time code and the second time code and a minimum of a first period of the first clock signal and a second period of the second clock signal; and
subtracting a second difference between the first skew code and the second skew code from the modulus, the second difference being indicative of a routing mismatch between the time-to-digital converter circuit and the first bonding pad and the second bonding pad.

11. An integrated circuit comprising:
a first bonding pad configured to receive a first clock signal having a first frequency;
a second bonding pad configured to receive a second clock signal having a second frequency, the second frequency being integrally related to the first frequency; and
a delay measurement circuit comprising a time-to-digital converter circuit, the delay measurement circuit being configured to generate a delay code corresponding to a delay between a first signal edge of the first clock signal received by the first bonding pad and a second signal edge of the second clock signal received by the second bonding pad, the delay code being generated based on a first time code corresponding to the first signal edge, a second time code corresponding to the second signal edge, a first skew code, a second skew code, and a period of the first clock signal or the second clock signal, the first skew code being indicative of a first delay of a first conductive path coupled between the first bonding pad and the time-to-digital converter circuit and the second skew code is indicative of a second delay of a second conductive path coupled between the second bonding pad and the time-to-digital converter circuit.

12. The integrated circuit as recited in claim 11,
wherein in a first mode of operation, the delay measurement circuit is configured to generate the first skew code and the second skew code, and
wherein in a second mode of operation, the delay measurement circuit is configured to generate the first time code and the second time code.

13. The integrated circuit as recited in claim 11 wherein the delay measurement circuit further comprises:
a first skew circuit disposed proximate to the first bonding pad;
a second skew circuit disposed proximate to the second bonding pad;
a first pair of conductive traces coupled to the first skew circuit;
a second pair of conductive traces coupled to the second skew circuit; and
a switch circuit configured to selectively couple the time-to-digital converter circuit to the first skew circuit via the first pair of conductive traces and the second skew circuit via the second pair of conductive traces, the first skew circuit and the second skew circuit being configured as zero-delay-return paths in a first mode of operation, and the first skew circuit and the second skew circuit each being configured as a synchronized pass path in a second mode of operation.

14. The integrated circuit as recited in claim 13 wherein the first skew circuit comprises:
a state element having a data input coupled to a first conductive trace of the first pair of conductive traces and a control terminal coupled to the first bonding pad; and
a select circuit configured to selectively couple an output of the state element and the first conductive trace to a second conductive trace of the first pair of conductive traces in response to a control signal.

15. The integrated circuit as recited in claim 13 wherein the switch circuit is configured to selectively couple a first conductive trace of the first pair of conductive traces and the second pair of conductive traces to an input of the time-to-digital converter circuit and to selectively couple a second conductive trace of the first pair of conductive traces or the second pair of conductive traces to an output of the time-to-digital converter circuit.

16. The integrated circuit as recited in claim 11 wherein the delay measurement circuit further comprises a processing circuit configured to generate the delay code based on the first skew code, the second skew code, the first time code, the second time code, and a first period of the first clock signal or a second period of the second clock signal.

17. The integrated circuit as recited in claim 16 further comprising a variable delay buffer coupled to the first bonding pad and configured according to the delay code.

18. The integrated circuit as recited in claim 16 further comprising a phase-locked loop coupled to a reference input signal derived from a clock signal received by the first bonding pad, an offset of the phase-locked loop being configured according to the delay code.

19. An integrated circuit comprising:
   a first bonding pad configured to receive a first clock signal having a first frequency;
   a second bonding pad configured to receive a second clock signal having a second frequency, the second frequency being integrally related to the first frequency; and
   means for generating a delay code corresponding to a delay between a first signal edge of the first clock signal at the first bonding pad and a second signal edge of the second clock signal at the second bonding pad, the delay code being generated based on a first time code corresponding to the first signal edge, a second time code corresponding to the second signal edge, at least one indicator of a routing delay of the means for generating the delay code, and a period of the first clock signal or the second clock signal.

* * * * *